United States Patent [19]

Ikeda et al.

[11] Patent Number: 4,489,247
[45] Date of Patent: Dec. 18, 1984

[54] INTEGRATED INJECTION LOGIC CIRCUIT WITH TEST PADS ON INJECTOR COMMON LINE

[75] Inventors: Masashi Ikeda, Urawa; Yukuya Tokumaru, Yokosuka; Masanori Nakai, Ebina; Masaki Ota, Yokohama, all of Japan

[73] Assignee: Tokyo Shibaura Denki Kabushiki Kaisha, Japan

[21] Appl. No.: 349,207

[22] Filed: Feb. 17, 1982

[30] Foreign Application Priority Data

Mar. 18, 1981 [JP] Japan .................................. 56-39236

[51] Int. Cl.³ .................. H03K 19/091; H01L 27/10; H01L 29/70; G01R 19/00
[52] U.S. Cl. ................................. 307/477; 324/73 R; 357/85; 357/92; 377/120
[58] Field of Search ..................... 307/442, 459, 477; 324/73 R; 357/85, 92; 377/28, 29, 120

[56] References Cited

U.S. PATENT DOCUMENTS

| | | | |
|---|---|---|---|
| 3,746,973 | 7/1973 | McMahon, Jr. | 324/73 R X |
| 3,781,683 | 12/1973 | Freed | 324/73 R X |
| 3,808,475 | 4/1974 | Buelow et al. | 357/40 |
| 4,178,584 | 12/1979 | Davis | 307/477 X |
| 4,348,600 | 9/1982 | Jarrett et al. | 307/477 X |
| 4,413,271 | 11/1983 | Gontowski, Jr. et al. | 357/85 X |

OTHER PUBLICATIONS

Shultis, "Semiconductor Wafer Testing"; *IBM. Tech. Discl. Bull.*; vol. 13, No. 7, p. 1793; 12/1970.
Klein et al., "Chip Power Test Circuit"; *IBM Tech. Discl. Bull.*; vol. 22, No. 8A, pp. 3256–3257; 1/1980.

*Primary Examiner*—Larry N. Anagnos
*Attorney, Agent, or Firm*—Finnegan, Henderson, Farabow, Garrett & Dunner

[57] ABSTRACT

An integrated injection logic circuit includes a plurality of integrated injection logic gates each having a PNP transistor for injector and NPN transistor for signal inversion, and an injector common line to which the respective injector PNP transistors are commonly connected. A test pad for electric probing is provided at least one location of the injector common line.

8 Claims, 8 Drawing Figures

F I G. 2
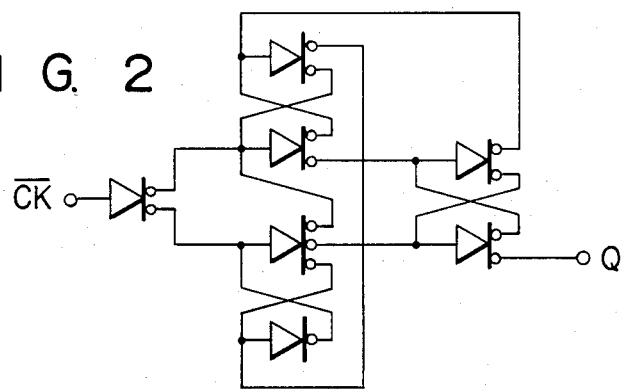
F I G. 3
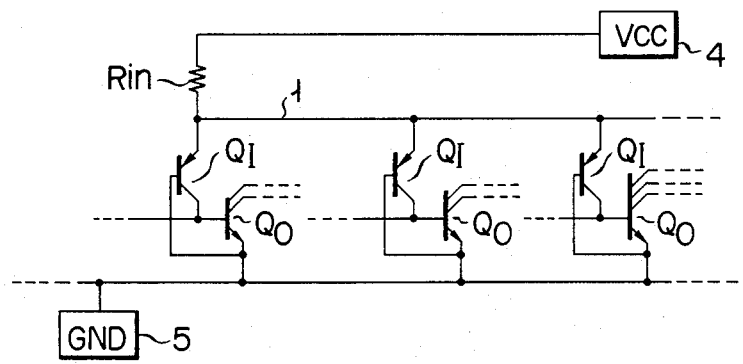

INTEGRATED INJECTION LOGIC CIRCUIT WITH TEST PADS ON INJECTOR COMMON LINE

BACKGROUND OF THE INVENTION

This invention relates to an integrated injection logic circuit ($I^2L$ circuit) and an improvement in which if the position of the formation of an electric probing test pad in an IC chip is properly selected, it is possible to enhance the electrical selection accuracy of good chips and to readily effect the faults analysis of defective chips.

A wafer obtained by integrating semiconductor elements in or on a semiconductor substrate is subjected to an electrical probing test before it is divided into individual IC chips, and marked as good and defective chips. The good chips are completed in a subsequent assembly process.

Where the IC chip suffers defects for some reason or other, a faults analysis is performed, but in an LSI chip having more than several thousands of elements therein a greater time and labor are necessary for analysis, because not only the circuit arrangement is complicated but also a wider area of the chip is tested. Although the degree of difficulty in analysis depends on the type of the circuit arrangement, if an integrated circuit of an $I^2L$ configuration includes a feedback circuit, it is very difficult to locate any defective elements in the IC chip and to ascertain a cause for the defects through the measurement of the element characteristics.

The $I^2L$ circuit includes normally 100 to 200 gates/mm$^2$ and as the mask pattern design rule, for example, the following dimensions are often used: the size of contacts: 4 $\mu$m $\times$ 4 $\mu$m (minimum dimension), the width of aluminium connections: 6 $\mu$m and a spacing between the aluminium connections: 6 $\mu$m. The connections of the high-integrated circuit are arranged very close to each other. In the faults analysis of the integrated circuit it is necessary to measure the characteristics of individual elements in the faulty chip and to cut out any desired spots or locations of the aluminium interconnection in such a high-integrated circuit. It is, therefore, very difficult to cut out any desired spots or locations of the interconnection due to the high integration of the chip. Even if this cutting operation is successfully performed, it is also very difficult to contact the tip of a rather thick probe with the spot or location of the aluminium interconnection. As a result, it follows that the reliance of the element characteristic data so obtained will be unavoidably lowered.

For this reason, test pads are conventionally provided, as required, for monitoring the characteristics of the circuits in the IC chip. The causes for faulty chips are often ascribed to the incompleteness of the element configuration occuring during the manufacturing process, such as the incomplete etching or overetching of electrode takeout contact holes and the breakage of the aluminium interconnection. The electric faults often include the deterioration of the withstanding voltage of elements, a drop of the amplification factor, the creation of a leakage current path, etc.

FIG. 1 shows a conventional $I^2L$ circuit on which test pads are formed. The $I^2L$ circuit is shown as a frequency division circuit having a $(\frac{1}{2})^n$ frequency division function and comprising flip-flops FF1 to FFn for $\frac{1}{2}$ frequency division, input and output interface circuits and some pads. The flip-flops FF1 to FFn, each, comprise seven $I^2L$ inverting gates as shown in FIG. 2. The input interface circuit is comprised of resistors R1 and R2 and NPN transistor Q1 and output interface circuit is comprised of a resistor R3 and NPN transistor Q2. The frequency division circuit further includes an injector common line 1 comprised of an aluminium connection to supply an injector current to the flip-flops FF1 to FFn, injector current setting resistor Rin connected to the injector common line 1, input pad 2, output pad 3, power source pad 4 for supply of a power source $V_{CC}$, ground pad 5 for ground potential GND and test pad 6. The respective pads 2 and 6 are formed to have a size enough great to permit a tip of the probe to be contacted with the pad. In the wafer state, the good and defective chips are selectively marked by checking, for example, (1) the normal or abnormal state of the signal line between the input pad 2 and the output pad 3, (2) a current value between the power source pad 4 and the ground pad 5 to see whether the consumption current is normal or not, and (3) a current value between the input pad 2 and the ground pad 5 to see whether individual elements such as resistors R1 and R2 have predetermined resistive values. Now suppose that some flip-flops are defective in the IC chip. In this case, any depective flip-flop such as the flip-flop FF1 can be located by measuring the test pad 6. Since, however, the flip-flop FF1 is comprised of seven $I^2L$ inverting gates as shown in FIG. 2, it is impossible to distinguish the defective gate from the good gates. Thus, further checking is required in connection with the flip-flop FF1. If the number of pads is increased by placing a pad for each junction of the adjacent flip-flops, the faulty spots or locations can be restricted to a narrower range, but this method involves an increase in the area of the chip and an increase in the manufacturing cost of the IC. For this reason, the test pad must be connected to a circuit point effective as a faults analysis means and in this way the number of pads must be restricted to a minimum possible extent required.

The inventors have found through the faults analysis of $I^2L \cdot IC$ that faults often occur at each step of the manufacturing process of the IC chip and are often ascribable to the following five causes:

(1) a leakage current path formed at an electrode takeout contact portion for connecting the respective element to the aluminium interconnection;

(2) the increase of a contact resistance due to incomplete contact between the contact portion and the aluminium interconnection;

(3) the lowering of the current amplification factor of transistor;

(4) the breakage of the aluminium interconnection;

(5) the incomplete configuration of an inpurity diffusion pattern.

The cause (4) can be brought to light by taking a photograph of the interconnection pattern at a magnification of $\times 100$ to $10,000$. The cause (5) can be ascertained under the microscopic observation. In either case, the results of these can be fed back to an improvement in the manufacturing process of the $I^2L$ circuit. The causes (1) to (3) are judged by electric checking, because an investigation into these causes cannot be made from an external checking. The causes (1) and (2) are ascribable to the incomplete formation of the contact hole, while the cause (3) is ascribable to the causes (1) and (2). The incomplete pattern configuration of the aluminium interconnection and the consequent potential drop on the aluminium interconnection load to a possible fault. It is therefore important to clarify the faults of the chip under the faults items mentioned.

FIG. 3 shows an interconnection of respective gates in an I²L circuit. The respective gate comprises a PNP transistor QI for injector and NPN transistor QO for signal inversion. In the I²L circuit an injector current is normally supplied from a power source pad 4 through a resistor Rin and a common line 1 for injector to the emitters of injector PNP transistors QI. The number of contact holes through which the corresponding injectors are connected to the common line 1 is substantially equal to the number of gates in the IC chip and there exist several thousands of such contact holes. It is possible to infer any good and defective chips, as well as any causes for faults in the defective chip, by checking the common line 1 for abnormality.

SUMMARY OF THE INVENTION

The object of this invention is to provide an integrated injection logic circuit which can judge the good or defective state of chips with high accuracy by properly selecting the formation position of a test pad for electric probing and can readily perform a faults analysis when the chip is defective.

According to one embodiment of this invention there is provided an integrated logic circuit comprising a plurality of integrated injection logic gates having injector means and signal inverting means, an injector common line to which the injector means of the logic gates are commonly connected, and a test pad for electric probing which is provided on at least one location of the injector common line.

According to another embodiment of this invention there is provided an integrated injection logic circuit comprising a plurality of integrated injection logic gates each having injector means and signal inversion means, a plurality of injector common lines to each of which a predetermined number of integrated injection logic gates are commonly connected, and a test pad for electric probing which is provided on at least one location of the injector common lines.

BRIEF DESCRIPTION OF THE DRAWINGS

FIG. 2 is a circuit diagram showing a flip-flop for ½ frequency division as shown in FIG. 1;

FIG. 3 shows an interconnection of each gate in an I²L circuit;

DETAILED DESCRIPTION OF THE PREFERRED EMBODIMENTS

Figure 1:
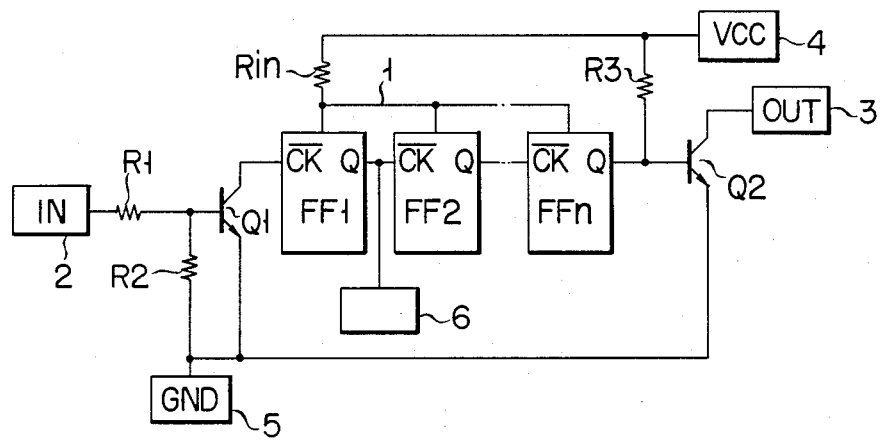
FIG. 1 shows a conventional I²L circuit having test pads.
Figure 4:
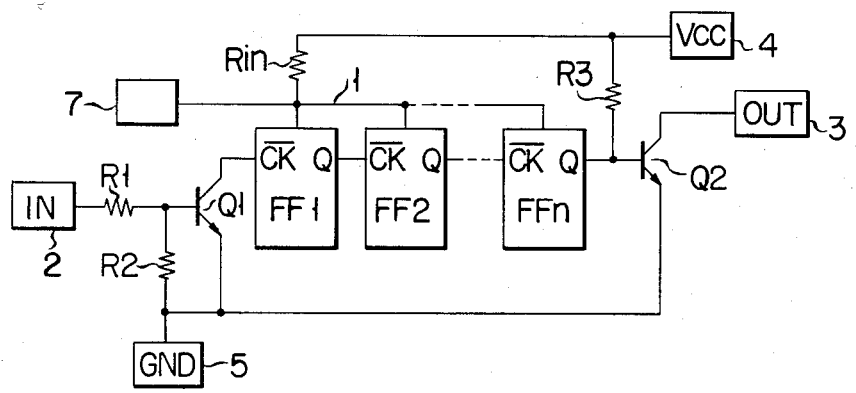
FIG. 4 shows an I²L circuit according to one embodiment of this invention.

One embodiment of this invention will be explained below by referring to the accompanying drawings. FIG. 4 shows an integrated injection logic circuit according to one embodiment of this invention. This circuit is shown as a frequency division circuit having a $(\frac{1}{2})^n$ frequency division function as in the conventional integrated injection logic circuit. In the arrangement as shown in FIG. 4, the same reference numerals are employed to designate parts or elements corresponding to those shown in FIG. 1 and further explanation is therefore omitted.

A difference between the FIG. 4 circuit and the conventional circuit resides in that a test pad 7 for electric probing is provided on one end of an injector common line 1 which is located near to a resistor Rin, the common line 1 being made of aluminium and adapted to supply an injector current to flip-flops FF1 to FFn. The pad 7 is formed, for example, by making the width of one end of the common line 1 greater.

The electric test of the FIG. 4 circuit is performed as follows.

By supplying a plus potential to the test pad 7 and ground potential to a ground pad 5, testing can be made as to whether or not a leakage current path is created in the injector current supply system. Since the PNP transistors QI for injector are all connected to one injector common line 1 as shown in FIG. 3, if there is a leakage current path between the emitter and the base of any one (QI) of several thousands of gate transistors, electric current flows through the test pad 7 and the ground pad 5. If at this time the presence or absence of electric current between the test pad 7 and the ground pad 5 is detected, it is possible to locate the presence of the leakage current path in the injector current supply line system. A leakage current path is often caused to occur due to the overetching as involved when the contact hole for the emitter of the injector PNP transistor QI is formed. This test permits a high accurate judgement to be made as to the good or defective state of chips, and permits the faults cause to be readily located. Where testing as to the presence or absence of the leakage current path is made, as in the conventional I²L·IC, between a power source pad 4 and the ground pad 5, it will be necessary to check the faults causes over a wider range, because in the I²L·IC not only flip-flops FF1 to FFn but also input and output interface circuits are parallely arranged between the source $V_{CC}$ and the ground potential.

Figure 5:
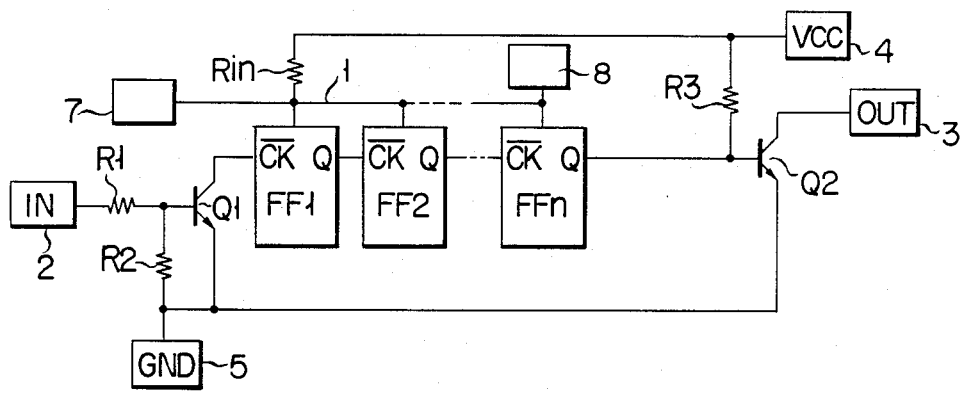
FIG. 5 shows an I²L circuit according to another embodiment of this invention.

FIG. 5 shows an integrated injection logic circuit according to another embodiment of this invention. In this embodiment, probing test pads 7 and 8 are formed on the corresponding ends of an injector common line 1 i.e. the pad 7 being located on that end of the common line 1 which is near to a resistor Rin and the pad 8 being located on that end of the common line 1 which is most remote from the resistor Rin. Where the aluminium interconnection of the injector common line 1 is wholly or locally much narrowed, it is not possible to disregard a potential drop on the aluminium interconnection per se. In such a case, the injector current to be supplied to the gate of the I²L circuit becomes insufficient and thus the gate transistor is driven in a bias setting range corresponding to a small current amplification factor, resulting in a lowering in the operation speed of the I²L circuit and the consequent malfunction. Therefore, the testing of the injector common line per se is important for faults analysis. In this embodiment, the formation state of the injector common line 1 can be grasped by flowing a predetermined current between the test pads 7 and 8 and ascertaining a voltage drop therebetween. In this way, it is possible to judge whether the current amplification factor of the transistor is good or bad. It is also possible even in this embodiment to make a test for the presence or absence of a possible leakage current path as in the preceding embodiment, by using the test pad 7 or 8.

Figure 6A:
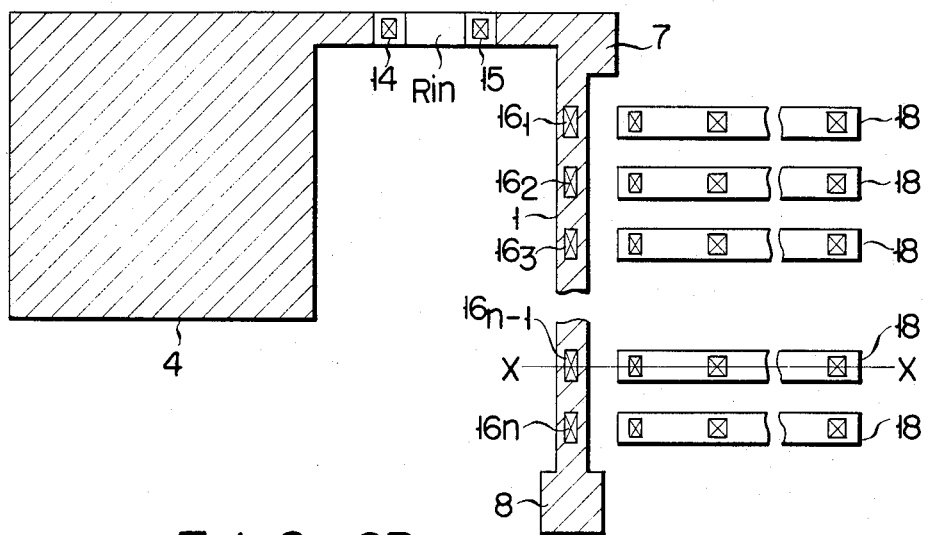
FIG. 6A is a pattern diagram showing part of the circuit as shown in FIG. 5.
Figure 6B:
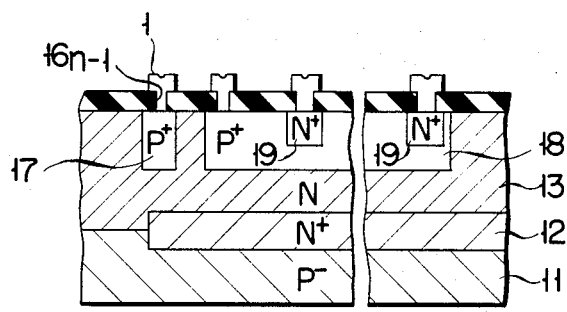
FIG. 6B is a cross-sectional view as taken along line X—X in FIG. 6A.

FIG. 6A shows a pattern diagram of the portion of the circuit as shown in FIG. 5, whereas FIG. 6B shows a cross-sectional view as taken along line X—X in FIG. 6A. In the circuit as shown in FIG. 5 an N+ type embedded region 12 is formed in a P− type semiconductor substrate 11 and an N-type epitaxial region 13 is formed on the resultant structure. The power source pad 4 is an aluminium layer formed on the N-type epitaxial region 13, and is formed to have such a dimension of about 100 $\mu m \times 100$ $\mu m$ as to permit a wire to be bonded to the surface of the pad. The portion of the pad 4 is connected through a contact hole 14 to one end of the resistor Rin for injector current setting which is formed by diffusion into the N-type epitaxial region 13. The other end of the resistor Rin is connected through a contact hole 15 to the injector common line 1 formed of aluminium, and the injector common line 1 is formed to have a width of about 5 $\mu m$. One end of the injector common line 1 which is located near to the resistor Rin is so widened as to have a width of about 10 $\mu m \times 10$ $\mu m$ and, in this way, the pad 7 is formed. Likewise, the pad 8 is formed by so widening the other end of the commonline 1 as to have a width of about 10 $\mu m \times 10$ $\mu m$. The injector common line 1 as defined between the pads 7 and 8 is connected through respective contact hole $16_1$, $16_2$, $16_3$ ... $16_{n-1}$, $16_n$ to a P+ type region 17 i.e. the emitter region of the PNP transistor QI constituting the I²L inverting gate. The PNP transistor QI is formed as a lateral type transistor having its base region comprised of an N-type epitaxial region 13 and its collector region comprised a P+ type region 18 in the N-type epitaxial region 13. NPN transistors QO, comprised of I²L inverting gates, in each of flip-flops FF1 to FFn are each formed as a vertical transistor having its collector regions comprised of N+ type regions 19 in the P+ type region 18, its base region comprised of the P+ type region 18 and its emitter region comprised of the N-type epitaxial region 13.

Figure 7:
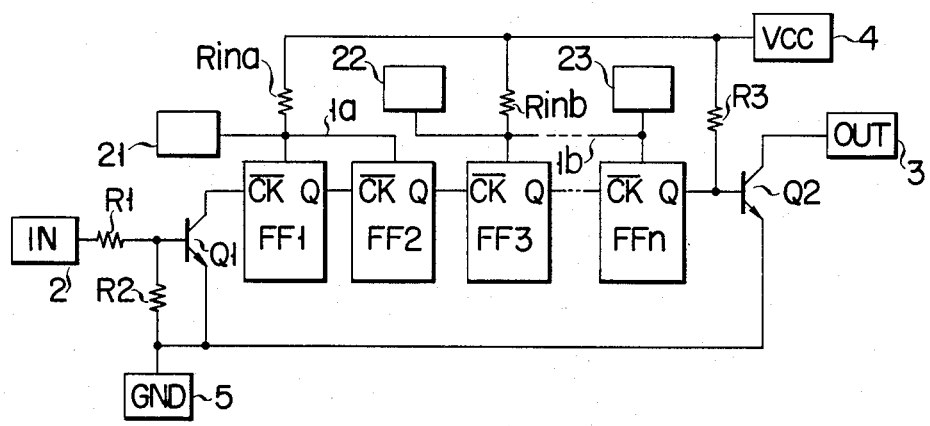
FIG. 7 shows an I²L circuit according to another embodiment of this invention.

FIG. 7 shows an integrated injection logic circuit according to another embodiment of this invention. In this embodiment, n flip-flops are divided into two groups, one group for flip-flops FF1 and FF2 and the other group for flip-flops FF3 to FFn. One group of flip-flops FF1 and FF2 is connected to an injector common line 1a and the other group of flip-flops FF3 to FFn is connected to an injector common line 1b. The common lines 1a and 1b are connected respectively through injector current setting resistors Rina and Rinb of different values to a power source pad 4. The circuit arrangement is so designed as to obtain a different operation speed for the respective group of flip-flops. A test pad 21 is formed on one end of the injector common line 1a which is located near to the resistor Rina. A test pad 22 is provided on one end of the injector common line 1b which is located near to the resistor Rinb and a test pad 23 are provided on the other end of the injector common line 1b.

In this embodiment, the pair of pads 22, 23 are provided only on one injector common line 1b of longer connection and thus it is possible to grasp the formation state of the injector common line 1b. As in the case of the pads in FIG. 6A, the respective pads 21, 22 and 23 are provided by locally increasing the width of the injector common lines 1a, 1b made of aluminium.

This invention is not restricted to the above-mentioned embodiments. Although, for example, the frequency division circuit has been explained as an I²L circuit, this invention can be equally applied to any logic circuit.

What we claim is:
1. An integrated injection logic circuit comprising:
   a plurality of integrated injection logic gates having injector means;
   an injector common line to which the injector means of the respective integrated injection logic gates are commonly connected; and
   at least two test pads for electric probing provided on the injector common line.
2. An integrated injection logic circuit according to claim 1, in which said test pads are provided at the ends of said injector common line.
3. An integrated injection logic circuit according to claim 1, in which said injector means includes a PNP transistor.
4. An integrated injection logic circuit according to claim 1, in which said test pads include an increased width portion of said injector common line.
5. An integrated injection logic circuit comprising:
   a plurality of integrated injection logic gates each having injector means;
   a plurality of injector common lines to each of which a predetermined number of said plurality of integrated injection logic gates are commonly connected; and
   at least two test pads for electric probing provided on each of the injector common lines.
6. An integrated injection logic circuit according to claim 5, in which said test pads are provided at the ends of each of said injector common lines.
7. An integrated injection logic circuit according to claim 5, in which said injector means includes a PNP transistor.
8. An integrated injection logic circuit according to claim 5, in which said test pads include an increased width portion of said injector common line.

* * * * *